United States Patent [19]

Davis

[11] 4,184,872
[45] Jan. 22, 1980

[54] ADDITIVE SYSTEM OF COLOR PHOTOGRAPHY BASED ON IRIDESCENT PIGMENTS

[76] Inventor: Chester Davis, 1685 Atson La., Cincinnati, Ohio 45205

[21] Appl. No.: 738,449

[22] Filed: Nov. 3, 1976

Related U.S. Application Data

[63] Continuation-in-part of Ser. No. 549,707, Feb. 13, 1975, Pat. No. 4,010,293, and a continuation-in-part of Ser. No. 549,706, Feb. 13, 1975, Pat. No. 4,065,158.

[51] Int. Cl.² .................. G03C 1/72; G03C 7/04; G03C 1/68; C03C 5/00
[52] U.S. Cl. .................. 43/365; 430/375; 430/542; 428/324
[58] Field of Search .................. 96/112, 82, 2, 24, 25, 96/97, 87 R, 27, 88, 34, 38.1, 115 R; 106/291; 428/454, 372, 378, 386, 324

[56] References Cited

U.S. PATENT DOCUMENTS

| | | | |
|---|---|---|---|
| 2,482,547 | 9/1949 | Kerridge | 96/34 |
| 2,690,966 | 10/1954 | Minsk et al. | 96/115 R |
| 2,712,996 | 7/1955 | Elliott | 96/115 R |
| 3,087,828 | 4/1963 | Linton | 106/291 |
| 3,107,170 | 10/1963 | Netke | 96/27 |
| 3,481,663 | 12/1969 | Greenstein | 428/324 |
| 3,910,793 | 10/1975 | Peisach | 96/82 |

FOREIGN PATENT DOCUMENTS 149 of 1860 United Kingdom .................. 96/34

OTHER PUBLICATIONS

The British J. of Photography, vol. 40, Supl. Aug. 4, 1893, pp. 85 to 87–"Colour Photography"–F. Ives.
The History of Three–Color Photography–Wall ©1925, Am. Photog. Publ. Co., Boston.
Photography–Neblette, 6th Ed., 1962, Van Nostrand Co., N.Y., N.Y.

*Primary Examiner*—J. Travis Brown
*Assistant Examiner*—Louis Falasco
*Attorney, Agent, or Firm*—Wood, Herron & Evans

[57] ABSTRACT

An inorganic system of color photography in which colored images are recorded with compositions comprising a mixture of an iridescent pigment of the type displaying an interference-reinforced reflection color, and finely divided particles of a photosensitive material, such as a silver halide, which can be developed to give black or other light absorbing particles which will absorb light wavelengths complementary to the interference-reinforced reflection color of the iridescent pigment. The system does not require organic dyes in the final image, which is highly light-stable, and uses much smaller amounts of silver than conventional black and white photography.

23 Claims, No Drawings

ADDITIVE SYSTEM OF COLOR PHOTOGRAPHY BASED ON IRIDESCENT PIGMENTS

CROSS REFERENCES TO RELATED APPLICATIONS

This application is a continuation-in-part of my two copending applications Ser. No. 549,707, filed Feb. 13, 1975, titled "The Enhancement of Iridescent Colors to Provide Vivid Colorants and Printing Inks", now U.S. Pat. No. 4,010,293, issued Mar. 1, 1977 and Ser. No. 549,706, also filed Feb. 13, 1975, titled "Recording Sheet for Forming Intensely Colored Iridescent Indicia", now U.S. Pat. No. 4,065,158, issued Dec. 27, 1977.

SUMMARY OF THE INVENTION

This invention relates to an additive system of color photography which is based on the use of iridescent pigments of the type that display an interference-reinforced reflection color. It also relates to a system for forming light-stable colored images from compositions of light-sensitive materials and iridescent pigments that display interference-reinforced reflection colors, and thereby eliminates the need for organic dyestuffs for providing colored prints. Still further the invention relates to the formation of intensely colored light-stable image compositions based on finely divided metallic silver and interference pigments. This invention also relates to an improvement in the photographic process which provides a simple, inexpensive method for forming stable colored prints from small amounts of easily-developed, inexpensive image-forming compositions.

PRIOR ART

The historical background of photography in color has been exhaustively treated in many texts (*Color*, Time-Life Books, 1970, gives a brief, popularly-written background). The first reproducible recording of color in a photographic system is generally agreed to have been the work of James Clerk Maxwell, over a century ago. Maxwell used a series of three separate black and white images (respectively photographed through red, green, and blue filters) which were projected onto a white screen through three separate red, green, and blue filters to form a colored picture by additive mixtures of the colored lights.

Maxwell's demonstration of "color photography" (actually the formation of colored projected images) quickly led to methods for forming colored prints through the use of subtractive combinations of colored organic dyestuffs which selectively absorbed certain wavelengths of light, instead of mixing colored lights. From 1867 onwards, with one exception, all of the commercial photographic systems for forming colored images involved subtractive systems of colored organic dyes.

The one exception was a highly original but commercially impractical additive system of color photography which was the work of Gabriel Lippmann. It was based on the interaction of light waves to form interference colors. The Lippmann system was theoretically simply but remarkably complex in actual practice. As described in the reference just mentioned, it involved the use of a thick silver halide emulsion on an absolutely flat, mirror-like, light-reflecting surface. The surface of a dish of mercury was commonly used, but in certain cases a highly-polished metallic mirror was used.

In the Lippmann process, which was based on the diffraction of light by varying thicknesses of silver, a scene in color was reflected onto the surface of a Lippmann emulsion. Light waves of various colors (i.e., various wavelengths) penetrated the thick emulsion to the mirror-like surface, from which they were reflected back through the emulsion, creating "standing waves" that created light interference patterns (i.e., enhancement of some wave energies and diminishment of other wave energies). Development of the resultant light-exposed emulsions gave deposits of finely divided metallic silver, the concentration densities of which corresponded to the densities of the light-reinforced standing waves.

Upon viewing these developed emulsions against a mirror-like light-reflecting surface at precisely the correct angle (usually the perpendicular) the observer could see a colored iridescent print of almost gossamer-like fineness. (Samples of Lippmann color prints are on view at the Eastman Museum of Photography in Rochester, New York; to applicant's knowledge, no Lippmann color prints have been produced in texts on color photography because of the extremely weak intensity of the colors seen).

The Lippmann additive system of color photography was never used commercially, not merely because of the need for long exposures, thick emulsions, and an absolutely flat, mirror-like base, but primarily because of the very weak intensities of the iridescent colors obtained and the need to view the resultant print from precisely the right angle. Any slight movement of the observer's head caused the colored image to vanish without a trace.

The introduction of subtractive systems of recording images in color, based on organic dyes, quickly dominated research in commercial color photography. The earliest systems based on subtractive organic dyestuffs could be used only as additive color transparencies, which were viewed by light transmitted through the transparency from the back. The Autochrome process of the Lumiere brothers came as close to a true additive transparency as was possible with the use of subtractive dyes. Practical colored prints, which could be viewed by reflected light in the same manner as black and white prints, were successfully achieved by dye coupling systems first proposed by Fischer in Germany. Those dye coupling reactions made possible the rapid growth of modern color photography, despite the extremely poor light-stability of the dyes originally used. For forty years, the dye-coupling systems of Fischer in Germany and Godowsky and Mannes in the USA, dominated color photography. In recent years dye diffusion processes Polaroid's and Kodak's instant films) have come into commercial use.

The older dye development systems required the removal of (reduced) black metallic silver from the colored dye layers to enable the colored print to be seen. (This was done by "bleaching out" the metallic silver after the dye layers had been formed during development). In the more recent dye diffusion processes, preformed dyes diffuse away from the black silver through a white pigment layer (which hides the black silver beneath the light-reflecting white layer) onto a receptive surface above the white layer to form a colored print. The dye diffusion processes are a subtractive color system and require separation of the colors which form the colored image, from the black silver image which actually records the incident light. The black metallic silver cannot be "bleached out" in instant photography systems.

DETAILED DESCRIPTION

The present inventor has discovered a new method for recording color wherein the imaging is achieved with intensely colored compositions of metallic silver and iridescent pigments which display an interference-reinforced reflection color. These images possess excellent light-stability, they are low in cost, and they do not require complex coating or developing procedures. The intensely colored images can be viewed over in a much wider angle of observation than could the Lippmann process prints. And, because the silver itself is an intimate part of the colorant, there is no need for complex procedures to remove developed silver from a colorant, or a colorant from developed silver.

The colored prints of the present invention may be of one color, or they may be multi-colored. The colors may result from the use of one iridescent pigment (Iridescent Blue, Iridescent Red, Iridescent Green, etc.) or from an additive mixture of two or more pigments (i.e., Iridescent Blue plus Iridescent Red gives purple), as may be desired for a particular application. A silvery white is obtained by use of three primary color iridescent pigments (blue, red, and green, for example); hence "white" light may yield a white print directly. In short, the finely divided silver-iridescent pigment recording compositions of the present invention can be used in a wide variety of applications to record all of the important "colors" (white, blue, red, green, and yellow) and their important mixtures. Organic colorants are not required in the final print; hence, complex dye diffusion processes or complex developers are not required in the system of the present invention.

The iridescent pigments used in the present invention are nacreous materials and exhibit weak iridescence when dispersed in liquid. In the dry state, they are white, finely-divided, free-flowing powders. From an optics viewpoint, they comprise a base substrate of plate-like particles which are essentially transparent—"white" in air but transparent (translucent) or colorless when immersed in a vehicle of approximately the same refractive index. The plate-like particles have at least one overcoating of an essentially transparent material whose refractive index is substantially greater than that of the base substrate. They are prepared commercially by overcoating a micaceous substrate with an extremely thin film of a material such as titanium dioxide or zirconium dioxide, having a refractive index which is substantially higher than that of the base substrate and which is usually greater than about 2.0. Different reflection colors can be obtained by varying the thickness of the overcoating. By way of example, the manufacture of such pigments is disclosed in U.S. Pat. Nos. 3,087,828 and 3,553,001.

In the course of another investigation, applicant recently discovered a method for enhancing the interference-reinforced reflection color of such iridescent pigments, by applying to the surface of the pigment a thin layer of a solvent-soluble dye having an absorption band complementary to the interference-reinforced reflection color of the iridescent pigment. A small amount of dye has an enhancing effect out of proportion to its concentration. That discovery is disclosed in my previously identified pending application Ser. No. 549,707, now U.S. Pat. No. 4,010,293 to which reference may be had for a fuller description.

Briefly, as set forth in that application, the applicant discovered that in iridescent pigments of the type made be overcoating an essentially transparent plate-like substrate with a very thin layer of a material having a refractive index substantially higher than the substrate (the index of reflection of mica, for example, is 1.560), there is potentially available a much greater intensity interference-reinforced reflection color than is normally observed. (For a discussion of the phenomenon of interference reflection, see P. Baumeister and G. Pincus, "Optical Interference Coatings", pages 58–75, *Scientific American* for December, 1970.)

In normal practice, while one wavelength of light (the interference-reinforced reflection color) is strengthened by interference reflection from the first overcoating layer (the optical interference coating) on an iridescent pigment, those wavelengths of light which are transmitted through the essentially transparent iridescent pigment to its opposite surface are then refracted and reflected back to the observer's eye, and mix with the interference-reinforced reflection color. The result is that the total reflected (observed) beam of light is almost identical with the original incident beam.

In other words, the observed intensity of the reflected interference color is markedly diminished because it is still mixed with other portions of the incident "white light". For example, in the case of Iridescent Blue pigment (one which exhibits a weak blue interference-reinforced reflection color), the blue wave band is reinforced and reflected back from the first overcoating layer (the optical interference coating) and the red and yellow wave bands are transmitted through this overcoating, through the inner portions of the essentially transparent pigment to the pigment's opposite surface, whereupon these red and yellow wave bands are refracted and reflected back (considerable internal re-reflections may occur) to the observed to give almost complete reflection of the original "white light" spectrum.

However, the observed interference-reinforced reflection wave band is markedly enhanced if wavelengths complementary to it are absorbed and substantially removed by a colored layer. The colored particles absorb some or all of the complementary wavelengths which have been transmitted through the iridescent pigment's optical interference coating and which normally would be refracted and reflected back to the observer from the pigment. (In optics, one wavelength is complementary to another when their mixture in a light beam gives an impression of white or gray.)

One aspect of that discovery was that a single dye (such as a black dye), if used as the color-absorbing layer on the iridescent pigment, could enhance the interference-reinforced reflection color of two or more differently colored iridescent pigments, because the dye could absorb wavelengths complementary to the interference-reinforced reflection color of any iridescent pigment. This was initially envisioned as being of particular value to the use of organic dyes in color photography.

It then suddenly occured to the applicant that finely divided metallic silver, obtained by reduction of light-sensitive silver halide crystals in the photographic process, is sepia brown to black in color; and the finely divided brown to black silver particles obtained during photographic development, while not a soluble dye, might be used to form vivid recording colors with iridescent pigments. To test that hypothesis, a dilute solution (about 2%) of silver nitrate was applied to the surface of Iridescent Blue pigment (i.e., one which exhibits a weak blue interference-reinforced reflection color); and the silver ion was reduced with an alkaline solution of hydroquinone, thereby forming finely divided silver metal particles proximate to or around the discrete iridescent pigment particles. An intense blue coloration immediately resulted.

Correspondingly, application of a silver nitrate solution (1% to 3%) to particles of Iridescent Red pigment (one which exhibits a weak red interference-reinforced reflection color) and to particles of Iridescent Green pigment (one which exhibits a weak green interference-reinforced reflection color), followed by reduction of the silver ion with alkaline hydroquinone solution, gave an intense red and an intense green color, respectively.

It then was desired to ascertain whether such brilliant colors could be obtained from the reduction of finely divided silver halide crystals, as distinct from reduction of a continuous film of dissolved silver ion, because the halides are the most light sensitive silver compounds and are widely used in conventional black and white photography. For this purpose a dispersion of Iridescent Blue pigment in warm gelatin solution was prepared. To this was added a dilute solution of silver nitrate, followed by a solution of sodium chloride in sufficient quantity to precipitate all of the silver ion as silver chloride. The precipitated silver halide particles formed on and around the pigment particles. This system was exposed to bright sunlight for 25-30 minutes, then was reduced with alkaline hydroquinone, whereupon an intense blue color was again obtained. This demonstrated that developable, light-sensitive silver compounds could be used to enhance the pigment particles.

Dispersions in warm gelatin solutions (20% gelatin in water) containing silver nitrate (1% to 5% silver by weight of the iridescent pigment) were made of Iridescent Red pigment, Iridescent Green pigment and Iridescent Gold pigment (one which exhibits a weak yellow interference-reinforced reflection color). These were treated with enough sodium bromide solution to precipitate all of the silver ion as silver bromide. Upon exposure to sunlight, followed by reduction with alkaline hydroquinone solution, these formed, respectively, intense red, intense green, and intense yellow colors.

These experiments indicated that a means had been discovered for forming the four important primary colors (red, blue, green and yellow), without the use of any organic coloring matter. (In additive color photography, all other colors are derived from blue, red and green). Experiments were then made to form suitable photographic emulsions, coatings, and printing papers which would yield colored images from developed silver and iridescent pigments alone.

The many advantages of this new system quickly became manifest. A major advantage is that costs are much lower than for present-day color photography. At the present time, in the U.S., the dollar volumes of black-and-white photography and color photography are approximately equal, but the amount of black and white film sold and processed is approximately six to seven times greater than the volume of color film sold and processed. The difference is of course due to the high film price and high development price for color film as compared to the film price and development charges on black and white film. The dye diffusion films are very expensive. In this invention, a method is provided for forming an inexpensive colored image with a relatively cheap colorant in place of pure metallic silver. The present price of iridescent pigments as specialty chemicals for cosmetic purposes is $12 to $16 per pound for the purest grades, but large-scale manufacture should bring down the price considerably, for mica, which is preferred as the substrate material over thin plates of glass, $CaSO_4$, $BaSO_4$, etc., costs only 5¢ per pound. Intensely colored prints are obtained with only a small percentage of silver by weight of the image-forming constituents, as compared to the 100% silver content of the image in a conventional intense black and white image. Plainly, the color system of the present invention uses far less silver to provide an intense image than does black and white photography. This represents a considerable savings in the use of silver for photographic purposes, especially for x-ray purposes.

Another advantage is in respect to comparative complexity of development. Prior to the present discovery, all commercial systems of color photography have encountered the problem of removing black metallic silver from the color layers after development. In dye coupling systems, silver is bleached out of the color film after development; i.e., the silver is removed from the organic dyes. In the more recent dye diffusion processes, the colored dyes diffuse away from the black silver layer through a white coating, which hides the black silver layer underneath; i.e., the dyes are removed from the silver. In contrast, in the present invention the black silver actually enhances the interference-reinforced reflection colors of the iridescent pigments and thereby itself provides the intense colors observed. There is no need to separate silver from the color formed; indeed, it should not be separated. This discovery, therefore, completely eliminates the long-standing need to remove silver from a colored image, and thereby greatly simplifies the development process.

What has long been needed in the photographic art is a system of photography in color which would have the low cost and simplicity of black and white photography. Such a system is provided by the present invention, which eliminates expensive dyes and dye couplers, multiple coatings of dyes and silver halides, and expensive developing processes for forming the final image. In this invention the processing may be carried out in the same manner as conventional black and white films are developed, which is far simpler than present day color processing.

Finally, the present invention provides a colored print which is as light-stable as any black and white silver print and far more light-stable than any colored print based on organic dyes.

This system of the present invention is intended to provide a system of photography of its own, not merely to serve as a substitute for present-day color systems. The additive colors of the present invention can yield artistic effects not easily obtained by subtractive color systems now provided by organic dyes. These have merit in their own right, so that the present system is not intended merely to replace but also to supplement much black and white photography and much three-color subtractive process photography. For example, the blue to purple-violet colored prints in accordance with this invention compare very favorably, from an artistic standpoint, with conventional black and white prints.

Because the finely divided silver-iridescent pigment combination provides color by enhancement of the reflection color of the pigment, it is not directly possible to prepare a conventional "color slide" for projection use, nor is a color "negative" easily possible here; a colored print (which may be positive or negative) is obtained directly. Positive print emulsion upon development yields silver where no light has struck, and no silver where light has struck; negative print emulsion yields silver where light has struck, and no silver where no light has struck. However, a projector can be used to project colored pictures from these prints, in the same manner that microcards are projected using mirror reflections rather than through a lens. Hence, colored motion pictures made by the present discovery need not be transparencies obtained by subtractive dye systems. The light-absorbing black silver present in small amounts does not interfere with the interference reinforced reflection band, but it does remove the transmitted wave bands. Hence, a colored film or slide of the present invention on a transparent base, when used in an ordinary projector, only provides a weak black and white or a very weak colored image. (The weakness of the black and white image results from the fact that the amount of silver used herein to form a colored image is far less than the amount ordinarily present in black and white transparencies which do give an intense projected image.)

In other words, the colored additive system of the present invention will usually give the same type of results as subtractive dye systems, but in a different manner. The prints are preferably viewed by reflected light, and their applications to various photographic requirements (color projections, magnified color projections, etc.) must always take this difference into consideration, which is true of any new discovery.

The color systems of the present invention offer the advantages of low cost, simplicity, very great light-stability of the colors formed, freedom from toxicity, and greater flexibility in color formulation. The Lippmann system of color photography, based on the diffraction of light by varying concentrations of silver, gave prints of very low color intensity. The fundamental difference between the interference-reinforced wave band reflected from a thin film in the system of this invention, and the diffraction mechanism of the Lippmann process, enables very intense prints to be made in a commercially practical manner with the present system. The intense prints obtained can be viewed from a wide angle of observation, greater than the normal visual angle for observing photographs.

The actual operations of photography must, by the requirements of the marketplace, be simple. The following section shows the basic techniques for obtaining colored images using the new compositions and discusses the properties of the images formed with these compositions.

EXPERIMENTAL

The preferred iridescent pigments for use in the practice of this invention, made in accordance with previously identified U.S. Pat. No. 3,087,828, are available from Mearl Corp., 41 East 42nd Street, New York, N.Y. 10017, under the brand names "Flamenco Nacreous Pigments" and "Mearlin Nacreous Pigments". These have a mica substrate with a titanium dioxide overcoating. Red, blue, green and yellow (gold) interference-reinforced materials are now commercially available, and any of the important prismatic colors such as purple, can be obtained. Iridescent pigments have also been produced from a micaceous substrate with an overcoating of zirconium dioxide, rather than titania. In the dry form, all these pigments are white, free-flowing powders, and they exhibit a very weak iridescent color when wet with liquids. The Flamenco pigment has a more regular overcoating of titanium dioxide than the Mearlin brand pigments which have a somewhat irregular overcoating and yield a slightly less bright color when enhanced by silver. Either type can be used in the present invention.

The following tests A-D concern the intensity, light stability, additive color effects, and the use of various aspects of the invention in photographic systems.

Test A—Color Intensity

To determine the color intensity of the silver-iridescent pigment combinations at various proportions of silver in relation to the pigment, solutions were prepared of silver nitrate in distilled water. A solution containing 0.10 gram of silver nitrate to 10 ml. of distilled water was used to prepare colored pigments containing up to 4% silver (in relation to pigment weight); for pigments containing from 5% silver up to 50% silver, calculated amounts of dry silver nitrate were weighed and dissolved in distilled water. Aliquot portions each containing a known amount of silver nitrate were placed in beakers, and suitable amounts of distilled water were added. To each silver nitrate solution was added a known weight of an iridescent pigment (Iridescent Red, Green, Blue, Yellow, and Purple were used). To each beaker a warm solution of catechol (in slight excess) in water was added with stirring to suspend the iridescent pigment. The stirred suspension was then made alkaline with sodium carbonate solution.

The catechol reduced the silver nitrate to silver metal, which immediately precipitated out of solution as finely divided particles, with a substantial portion of the silver particles collecting on the surfaces of the iridescent pigment particles. An intense color, corresponding to the interference-reinforced reflection color of the particular pigment used in the respective case, immediately appeared. The suspension of the intensely colored pigment in water was poured into a collecting dish, and allowed to settle. Supernatant liquid was then removed by absorbent paper, and the color pigment was air-dried and collected as a dry powder. This powder, with the silver metal particles adherent to the pigment particles, even though dry displayed essentially the same intense coloration as its precursor wet suspended particles.

Very intense colors were obtained at weight proportions of silver (as metal in relation to pigment weight) of about 1 to 5%. Maximum intensity appeared to be reached at about 2.5% by weight of silver; above that amount, the intensity remained approximately constant, and the colored pigments progressively exhibited a slightly deeper hue. Compositions with 5% and 10% silver were very intense but noticeably somewhat deeper in hue than at 3.6% silver. Compositions with 20% and 25% silver were quite deep in hue; above 25% silver, the light-absorbing properties of the silver began to dominate the resultant color. There was only a slight degree of difference in intensity between 1.3% silver and 2.5% silver. Proportions of 0.5% to 1.0% silver gave very satisfactory color enhancement; and as little as 0.1% silver gave noticeable color enhancement but very light hue.

For many commercial image-recording purposes, an image composition which ranges from 0.1% to 2.5% silver by weight of silver-iridescent pigment combination gives a full range of shades for recording different hues. Because silver halide is the most expensive coating ingredient preferred for use in the present system, the amount of silver halide used is desirably kept to the minimum effective level possible; the preferred range is one which yields from about 1% to about 5% of metallic silver by weight in the most intensively colored portion of the final image. Where necessary, however, silver-iridescent pigment compositions containing as much as 25% silver by weight can be used.

Micaceous substrates containing an overcoating of zirconium dioxide gave approximately the same results as the titanium dioxide on mica materials; however, the titanium dioxide-coated micas seem to have very slightly more intense colors, when enhanced with finely divided silver, than the corresponding zirconium dioxide coated micas.

Test B—Light Stability

Light-stability tests were run on the silver-iridescent pigment compositions by themselves; as developed in a gelatin coating; and as colorants dispersed in a transparent lacquer.

The silver-iridescent pigment compositions containing 5% silver showed no fading after direct exposure to sunlight for five months. The silver-iridescent pigment compositions developed and fixed in gelatin were exposed to normal indoor light for ten months with no detectable fading. The silver-iridescent pigment compositions in gelatin were exposed to direct sunlight under glass for almost eight months with no detectable fading.

Colored Kodak prints and colored Polaroid prints, as well as black and white Kodak prints, were exposed to direct sunlight under glass for five months. At the end of five months, the colored Kodak prints and the colored Polaroid prints showed noticeable fading but the black and white prints showed no fading. The colored prints of the present invention which use silver-iridescent pigment compositions and which showed no fading after eight months were, therefore, fully as stable as conventional black and white silver prints and far more stable than the commercial colored prints based on organic dyes.

Compositions which contained 5% silver on Iridescent Red, Green, Blue and Gold pigments were each dispersed in a transparent lacquer and painted on wood and on paper. The dried lacquers had excellent colors and were exposed to direct sunlight under glass for about five months. At that time, the lacquer coating itself had turned dark in color and suffered noticeable deterioration. The Iridescent Blue, Iridescent Green, and Iridescent Gold dispersions showed no fading whatsoever; the Iridescent Red dispersion showed a very slight fading, noticeable only when compared with an unexposed sample.

I have found that Iridescent Red pigment has photosensitizing properties, and apparently transfers energy from the blue to violet spectrum band in some manner to enhance the red band. Such properties are apparently not possessed to such a marked degree by the other pigments, which transfer energy from bands possessing less quantum energy than the blue-violet. The silver-Iridescent Red Pigment composition in gelatin is quite light-stable, but in a vehicle which can undergo photo-oxidation upon long exposures to direct sunlight, such as certain lacquers, there may be a very slight fading of the red pigment after long exposures because of slight oxidation of the metallic silver to silver ion through "induced oxidation" by the light-unstable lacquer vehicle.

Test C—Additive Color Effects

Because of the additive nature of the reflected light from the interference-reinforced reflection pigments used herein, the primary colors obtained using such pigments are not the same as the primary colors used in subtractive color dye films. Since the work of Maxwell, the standard additive colors used have been red, green and blue, although a system based on violet, orange, and green has also been proposed.

The silver-enhanced iridescent pigment colors of the present invention can be physically mixed (and thereby combined additively) to yield all of the important colors. The resultant prints may not be an exact color match of the original scene, but this is true of all printing operations. For best results with the pigments of the present invention, a four color primary is preferred; but for the usual commercial applications, a three-color palette (red, green and blue) is satisfactory.

Mixtures of these pigments were made, and the results were in agreement with additive color theory: mixtures of blue and green were blue-green; mixtures of red and blue were purple, and mixtures of red and green were yellow. The yellow color is not as intense as the yellow from a silver-enhanced Iridescent Gold pigment, but it is an attractive soft shade of yellow. A mixture of Iridescent Purple and Iridescent Gold gives an attractive pink which is good for rendering "body color". One value of the additive colors obtained from silver-enhanced iridescent pigments is that they have a soft, pleasing effect on the eye compared to the harsh, garish colors sometimes obtained from organic dyestuffs.

Test D—Photographic Systems

The preferred light-sensitive materials to be used in the practice of this invention are the commonly used silver halides, i.e., the chloride, bromide and iodide, and mixtures thereof. Because of their insolubility and high light sensitivity, these are the most advantageous for many purposes. However, their use is not critical, and it is contemplated that other light-sensitive materials can be used, including (by way of example and not limitation) silver nitrate and silver phosphate, which after exposure to light can be converted to black or at least to light absorbing particles which will absorb the wavelengths complementary to the interference-reinforced reflection color of the pigment.

Despite the introduction in recent years of various new binders for light-sensitive silver halides in photography, gelatin is still the binder of choice for many modern photographic systems. For this reason, gelatin was the most extensively investigated binder for the system of the present invention. However, it should be understood that other polymeric binders, such as albumen, hydrogen casein, soybean protein, polyvinyl acetate, cellulose acetate, and cellulose acetate butyrate can be used to bond the light-sensitive silver halide-iridescent pigment compositions to a base support. The base support may be any of the conventional base materials, including paper, glass, plastic, metal, ceramic, or synthetic polymer.

Light-sensitive silver compounds, such as silver chloride, silver bromide, silver iodide, silver nitrate, and mixtures of these materials, were prepared. Silver chloride systems can be coated under dim light conditions, because they possess low light sensitivity, whereas silver bromide and silver iodide cannot. However, silver chloride emulsions require somewhat longer light exposure for good print formation. The silver iodide emulsions have very good light-sensitivity and give good colored prints upon development, but require light-free darkroom conditions for successful coating and for successful development, and their storage life appears to be shorter than that of the others. The best results have been obtained with silver bromide and mixtures of silver bromide with silver iodide (the so-called silver iodobromide).

As previously mentioned, it is an advantage of the invention that conventional black and white developers can be used to develop the light-exposed silver halide-iridescent pigment systems of this invention. A wide variety of these have already been tested and found useful. The original work was done with laboratory preparations of hydroquinone and of catechol in alkaline solutions but, as the work progressed, commercially available developers were tested and found to be satisfactory. While catechol is an excellent reducing agent, its solutions appear to be too unstable on standing in air to be of great value. The Kodak developers sold under the trademarks "Microdol", "D-76" and "Dektol" are all suitable for use herein. These are based on different proportions of hydroquinone and p-methylaminophenol. Dektol developer was mainly used but to slow its action the standard solution should advantageously be diluted with cold distilled water before use and kept cool during development.

The stop bath, used to stop developer action, can suitably be the conventionally used acetic acid in distilled water, and also should preferably be cooled for use.

The prints can be fixed in the same manner as ordinary black and white prints, with Kodak Fixer, a general purpose fixer and hardener for film, plates, and paper emulsion systems, and comprising a mixture of hypo and alum, is suitable for this purpose. The fixed prints should be immersed in water to remove the hypo, but this is not absolutely necessary when excess hypo remains in the final film, as in the case with "instant film".

Thus, one very important value of the present system for photography in color is that it does not require any new developing method or new developers, hardeners, or fixers. The agents presently known in the art for developing and printing black and white films and prints can be used quite successfully to develop and print colored images formed with the present invention. More broadly, the invention contemplates the use of any means for selectively transforming the exposed photosensitive compound to black particles or, more generally, to light absorbing particles which will absorb wavelengths complementary to the interference reflection color of the particular pigment used.

The successful incorporation of the silver-iridescent pigment compositions into photographic systems should take into account some considerations which differ from present standard procedures. The particle sizes of iridescent pigments are larger than the silver halide crystal particles and the silver particles which result from the development of light-activated silver compounds. Where the halide crystals are formed as a precipitate from a nitrate solution, whether in the presence of the iridescent pigment or separately and then added to the iridescent pigment system, they are only closely proximate to or loosely attached as a deposit on the iridescent pigment particles. Vigorous development procedures may therefore carry off some of the loosely attached silver and diminish the color intensity of the developed print. The silver halide and the metallic silver particles appear to be attached to the iridescent pigment particles by van der Waal forces rather than by strong primary chemical bonds.

Because silver halides have a higher density than the preferred iridescent pigments, some separation into layers may occur during coating operations unless the binder adequately suspends the pigment compositions in the coating compositions during the coating operation. When this occurs, such separated layers may be manifested, after development, as a brown to black silver image beneath a weakly iridescent layer, instead of the desired intensely colored image. Therefore, care must be taken that the silver halide-iridescent pigment composition is thoroughly dispersed and suspended in the coating composition by the binder used and that the binder used thoroughly bonds the composition onto the base web. If the binder used is inadequate or insufficient to thoroughly bond the recording composition to the base web during the development process, overly vigorous development may carry off the iridescent pigment from the base web, leaving no colored image on the base web. A small amount of a wetting agent may be incorporated into the system to overcome this problem. Sodium lauryl sulfate and similar wetting agents are quite satisfactory for this purpose. Alternatively, the system may be allowed to stand for some time before it is coated onto the web, to wet the pigments more thoroughly.

When care is taken to use adequate binder compositions and correct dispersion of the silver halide-iridescent pigment compositions in the binder compositions, strong coatings are obtained with the silver halide and the reduced silver bound to the iridescent pigment, and the pigment bound to the base web.

By way of example, photographic emulsions were made with varying amounts of gelatin binder to iridescent pigment containing standard amounts of silver halide (5% by weight of pigment). Binder/pigment ratios of 1:1, 2:1, 3:1, 4:1, etc. were examined. Because of the large surface area of the finely divided iridescent pigments, a considerable amount of the binder is required merely to coat the surfaces of the pigment particles, and additional binder must be available to bond the pigment to the base support. When the gelatin coatings are wetted by water development, coatings with insufficient proportions of binder tend to lose iridescent pigment, as previously mentioned. For best results, at least three parts of gelatin to one part of iridescent pigment are preferred, but smaller amounts can be used if care is taken during development. Four to five parts of gelatin to one of iridescent pigment give good coating and developing characteristics for many applications. The most advantageous porportions for any specific binder and support can easily be determined by comparison of a progressive series of mixtures. As previously mentioned, a silver halide concentration of about 1 to 5% by weight silver (as metal, in relation to iridescent pigment weight) is preferred, although as much as 20% to 25% silver can be used if desired.

Reflection of light from the myriads of pigment platelets may cause slight "halation" if long exposures and/or long development times are used. This problem is not encountered with shorter exposure and/or development times, and it can also be minimized or avoided by adding a conventional antihalation agent, or by using a base web which has a black surface.

Development of photographic emulsions containing irridescent pigments occurs somewhat more rapidly than with the corresponding silver halide emulsions alone, possibly because the incorporation of such pigment particles causes stress in the surrounding layer of binder which gives "cracks" into which developer solution flows more readily. Shorter development times result from this effect; hence, lower temperatures during development or more dilute developers give faster results than are obtained with ordinary photographic emulsions. All of these differences just mentioned can easily be handled with some experience.

Techniques are well known in the photographic art for sensitizing (and desensitizing) silver halides to certain wavelengths of light. Techniques are also well known for screening out certain wavelengths of light from one group of silver halide crystals while enabling other wavelengths of light to penetrate those crystals. These techniques are discussed at length in the standard texts on photography to which reference may be had. Multiple light-responsive coatings on base webs have also long been known to the art. From the present disclosure, those skilled in the art will be able to use conventional supplementary technology as appropriate in applying the present invention to various specific purposes.

The following examples illustrate various specific compositions and methods for carrying out the invention.

EXAMPLE 1

A coating composition comprising:
30 gms. gelatin in 90 ml. warm distilled water
10 gms. Iridescent Red 100
0.20 gm. silver nitrate in 20 ml. warm water
0.13 gm. sodium bromide in 20 ml. warm water
was made up. The gelatin was added to the 90 ml. water and warmed in a water bath. The Iridescent Red 100 was dispersed in the warm gelatin solution with stirring, and the warm silver nitrate solution was then added. In the absence of light, the sodium bromide solution was added to the stirred dispersion, and there reacted with the silver nitrate to form insoluble, light-sensitive particles of silver bromide. The precipitated silver bromide particles formed around or proximate to the discrete pigment particles, and provided a layer or loose coating on them. This light-sensitive silver halide hydrophilic colloid emulsion was coated onto bond paper with a coating rod and the resultant photographic printing sheets were dried in the dark. These sheets were placed under negatives (to give positive prints of the negative images), in a printing frame and exposed to light for periods of 5 to 60 seconds. The light-exposed papers were then developed in diluted "Dektol" developer, stopped, and fixed with Kodak Fixer. The development of the exposed silver bromide particles converted them in situ to black metallic silver particles, closely adjacent the pigment particles. The image so formed consisted of about 1.3% silver by weight of pigment, at maximum development. The resulting prints displayed an attractive red color.

EXAMPLE 2

A coating composition comprising:
30 gms. of gelatin in 90 ml. warm distilled water
9 gms. Iridescent Purple pigment
0.65 gm. silver nitrate in 20 ml. warm water
0.40 gm. sodium bromide in 20 ml. warm water
was made up by adding the gelatin to the water with warming in a water bath. The Iridescent Purple was dispersed in the warm gelatin with stirring and the warm silver nitrate solution was added to this dispersion. In the dark room, the sodium bromide solution was added to the stirred dispersion. This reacted with the silver nitrate to form light-sensitive silver bromide. In the dark room, this emulsion was coated onto standard bond paper and dried in darkness.

The resulting photographic paper was placed under negatives in a printing frame and exposed to light for different amounts of time (in direct sunlight for 5–40 seconds). Most useful exposure times for given light conditions are easily determined by a sequence of different exposure times. The exposed prints were developed for about two minutes in diluted Dektol developer to convert the exposed silver bromide essentially to black finely divided metallic silver, then were stopped, fixed, and water-washed. The resultant silver-Iridescent Purple prints were very attractive and pleasing to the eye. They compare favorably with black and white images composed of 100% silver, although they contain only about 4.4% silver by weight on the pigment at full development.

EXAMPLE 3

A coating composition comprising:
15 gms. gelatin in 45 ml. warm water
10 gms. Iridescent Gold 100
1.0 gm. silver nitrate in 15 ml. warm water
0.60 gm. sodium bromide in 18 ml. warm water
was made up as above and the resultant emulsion was carefully coated onto bond paper in the dark room. The papers were air-dried in the dark. The resultant photographic papers were exposed to sunlight under negatives in a printing frame, developed with cold, dilute Dektol developer, stopped, and fixed. The resultant yellow prints had excellent intensity. The intensely colored image formed consists of about 6% silver by weight of colored pigment, at full development.

EXAMPLE 4

A coating composition comprising:
20 gms. gelatin in warm water
5 gms. Iridescent Red 100
0.20 gm. silver nitrate
0.14 gm. sodium bromide
was prepared as above to give a total amount of 20 gms. gelatin in 90 ml. water containing the light-sensitive silver bromide and Iridescent Red pigment. The silver proportion (as metal) was 2.5% by weight of the colored pigment at full development. This emulsion had good coating characteristics. Good red prints were obtained with these photographic printing papers.

Similar coatings were made up with Iridescent Blue and Iridescent Greem pigments, and these gave good blue and good green prints, respectively.

EXAMPLE 5

A coating composition comprising:
15 gms. gelatin in 45 ml. warm water
9.0 gms. of an Iridescent Blue zirconium dioxide-coated mica pigment
0.32 gm. silver nitrate in 15 ml. warm water 0.20 gm. sodium bromide in 15 ml. warm water
was made up as in Example 1 and half of this emulsion was coated onto standard bond paper and air-dried in a dark closet. To the remaining half of the emulsion was added 4.0 gms. of an Iridescent Red zirconium dioxide-coated mica pigment. The pigment was thoroughly dispersed in he emulsion to form a mixture of zirconium dioxide red and blue pigments. This emulsion was coated onto bond paper and air-dried.

The zirconium dioxide-overcoated mica with blue iridescent color gave prints of very good intensity; these contained about 2.2% silver by weight of pigment. The mixture of zirconium dioxide red and blue iridescent pigments gave a very good deep purple print upon light-exposure and development. This purple colored iridescent pigment formed from a mixture of red and blue pigments contained about 1.1% silver by weight.

EXAMPLE 6

A coating composition comprising:
30 gms. gelatin in 90 ml. warm water
10 gms. Iridescent Blue 100
0.40 gm. silver nitrate in 20 ml. warm water
0.25 gm. sodium bromide in 20 ml. warm water
was made up as in Example 1, and was coated onto standard bond paper in the dark room and air-dried in a dark closet. The resultant photographic printing papers were exposed to light in a printing frame under negatives for 30–50 sec., developed in Dektol developer which had been diluted with three parts of cold water to one of standard Dektol developer solution, stopped, fixed, and washed to give a good deep blue colored print. The pigment formed consists of about 2.5% silver by weight of colored pigment at maximum development.

A similar coating was made up with 10 gms. of Iridescent Green in place of the Blue, and the resultant papers gave good green prints.

EXAMPLE 7

A coating composition comprising:
15 gms. gelatin in 45 ml. warm water
3 gms. Iridescent Blue 100
3 gms. Iridescent Red 100
3 gms. Iridescent Green 100
0.40 gm. silver nitrate in 20 ml. warm water
0.25 gm. sodium bromide in 20 ml. warm water
was made up as in Example 1 and coated onto standard bond paper and air-dried in a dark closet. The pigment formed contains about 2.8% silver by weight of colored pigment, at maximum development. The resultant photographic paper was exposed and developed as above, but the resultant print was a silvery white on a white background. This demonstrates that a mixture of three primary color iridescent pigments gives a good white print and that "white light" will give a white print when all three iridescent pigments are color-enhanced.

A black "color" may be obtained by the use of a pigment-transparentizing vehicle on non-developed recording iridescent pigment composition in conjunction with a black base web or a black base coating; hence, "black" (which is the absence of light-reflection and which cannot be obtained from iridescent pigments alone) can be recorded as part of the image. Grays are obtained by the use of two complementary colors.

EXAMPLE 8

Two coating compositions comprising:
15 gms. gelatin in 45 ml. warm water
9 gms. Iridescent Blue 100
0.32 gm. silver nitrate in 15 ml. warm water
0.20 gms. sodium bromide in 15 ml. water
and
15 gms. gelatin in 45 ml. warm water
9 gms. Iridescent Red 100
0.32 gm. silver nitrate in 15 ml. warm water
0.20 gm. sodium bromide in 15 ml. warm water
were made up as in Example 1. The cooled emulsions were mixed without stirring, then coated onto standard bond paper in such a manner as to avoid thorough admixing of the two emulsions. The sheets were air-dried in a dark closet. The resultant photographic printing sheets were exposed to direct sunlight under negatives, then developed with Dektol developer, stopped, and fixed. The resulting prints were composed of three colors, red, blue and purple (the latter being a result of mixed red and blue colors) in interesting patterns. The purple had good intensity. The images formed in all three colors contain about 2.2% silver by weight of colored pigments, at maximum development.

Similar coatings made with emulsions containing Iridescent Red and Iridescent Green pigments also gave prints in three colors: red, green, and yellow. The yellow was very soft in color and lacked the intensity of silver-enhanced Iridescent Gold compositions.

EXAMPLE 9

Silver Iodobromide System

A coating composition comprising
30 l gms. gelatin in 90 ml. warm distilled water
10 gms. Mearlin Red
0.65 gm. silver nitrate in 20 ml. distilled water
0.20 gm. sodium bromide and 0.32 gm. potassium iodide in 20 ml. distilled water
was made up. The gelatin-distilled water was warmed in a water bath as the silver nitrate solution was added. In the absence of light, the sodium bromide-potassium iodide solution was added to the stirred gelatin, and there reacted with the silver nitrate to form insoluble, light-sensitive particles of silver iodobromide. After five minutes, the Mearlin Red powder was added with stirring to the warm silver iodobromide emulsion, and the resultant dispersion was stirred thoroughly in the water bath for another ten minutes. In this step, the previously formed silver iodobromide particles gathered on the surfaces of the iridescent pigment particles to provide a layer or loose coating on them.

This light-sensitive silver iodobromide hydrophilic colloid emulsion was coated onto bond paper with a coating rod and the resultant photographic printing sheets were dried in the dark. The resultant photographic papers were exposed to sunlight under negatives (some in a printing frame and others in a box camera), developed with cold, dilute Dektol developer, stopped and fixed. The resultant red prints had excellent intensity. The intensely colored image formed consisted of about 3.8% silver by weight of colored pigment at full development

EXAMPLE 10

Silver Nitrate System

Because the light sensitivity of the silver halides is high, they are the preferred light sensitive compounds for use in the present invention. However, as previously pointed out, it is possible to use other light-sensitive compounds which can be selectively transformed (for example by development) after exposure to yield light-absorbing materials which have an absorption band complementary to the interference reflection color of the pigment. As one example, silver nitrate can be used. Moreover, despite a very slow light-responsive, it possesses the advantage that it forms an image which is self-developing, i.e., which spontaneously transforms to silver.

An emulsion using silver nitrate as the photosensitive material was made up, comprising:
20 gms. of gelatin in 60 ml. warm water
10 gms. Iridescent Red 100
1.0 gm. silver nitrate in 20 ml. warm water The gelatin was dispersed in the warm water, and the Iridescent Red pigment was added and dispersed in the gelatin. The silver nitrate solution waas added with thorough stirring, and the coating composition was then coated in dim light onto standard bond paper. The printing paper was air-dried in a dark closet. The resultant printing paper was exposed to bright sunlight under a stencil for 15–20 minutes. The silver nitrate self-developed after exposure, without further treatment, to give an intense red image against a white background. (By self-developing is meant that the emulsion requires no external chemcials for forming color but develops color from the action of light, or light and heat, alone.) Similar coatings with Iridescent Green, Iridescent Blue, and Iridescent Gold were less photosensitive than the silver nitrate-Iridescent Red system but gave intense prints after long exposures to the middle ultra-violet.

EXAMPLE 11

Silver Phosphate-Albumen System

A coating composition comprising
31.7 gms. albumen in 70 ml. lukewarm water
10 gms. Mearlin Red
0.65 gm. silver nitrate in 14 ml. water
0.40 gm. trisodium phosphate in 15 ml. water was made up. The albumen (powdered dried egg white) was slowly added with stirring to the water to form a slightly viscous solution. The Mearlin Red was then thoroughly dispersed in the albumen solution. In the dark room, the silver nitrate solution was added to the stirred albumen-pigment dispersion. After five minutes, the trisodium phosphate solution was added with thorough stirring. The coating composition was allowed to stand ten minutes, then coated onto bond paper with a coating rod. The coated papers were air-dried in a dark closet. The resultant printing papers were exposed to bright sunlight under negatives in a Kodak printing frame for various periods of time from 30 seconds to ten minutes, then developed with undiluted Dektol developer, which was brushed onto the coating. After suitable development times, the acetic acid stop solution was then brushed onto the developed coatings, and the papers were fixed and hardened. Good red prints were obtained.

Albumen does not possess the strong sensitizing properties for silver systems that gelatin possesses, and silver phosphate does not possess the rapid photoresponse properties of silver bromide. Therefore, the above papers required considerably longer exposure times than do the silver bromide-gelatin-Mearlin Red systems. Gelatin coatings containing silver phosphate-iridescent pigment compositions require shorter exposure times than the corresponding albumen coatings; but they still require longer exposure times than do gelatin coatings containing silver iodobromide-iridescent pigment compositions.

EXAMPLE 12

Non-Silver Systems

E. J. Wall, *History of Three-Color Photography*, in 1925, gives a compendium of non-silver halide light-sensitive systems, to which reference is hereby made. I have found that non-silver systems such as those based on heavy metal ferricyanides, the reduction of molybdenum and tungsten compounds, and the formation of colored metal sulfides by decomposition of metal thioureas will function in the present invention to provide color by enhancement of the interference-reinforced reflection color of iridescent pigments. However, the quantum efficiency of present non-silver systems is not as good as that of silver-containing systems for photographic purposes. For document copying purposes, however, non-silver systems do have potential commercial applications.

EXAMPLE 13

Color Transparencies

The color images of the present invention are primarily intended for use as colored prints to be viewed by reflected light. The iridescent pigments exhibit a reflection color and a transmission color which is a complement of the reflection color. The color enhancement of the interference reinforced reflection color is achieved by the black metallic silver removing much of the transmitted light waves; therefore, the transmitted color is much weaker than the reflection color. Color transparencies to be viewed by transmitted light can be prepared from silver-iridescent pigment compositions but they are not as intensely colored as colored prints to be viewed by reflected light. Iridescent Red gives a green transmitted color; Iridescent Green gives a red transmitted color; Iridescent Gold gives a blue transmission color; Iridescent Blue gives an orange-red transmission color.

A self-developing transparency was prepared by coating a clear polyester film base with a dispersion of Iridescent Red and about 5% silver nitrate, in a clear cellulose acetate butyrate lacquer dissolved in amyl acetate containing a trace of amyl alcohol. The amyl alcohol acts as a sensitizer to the silver nitrate coloration in light. The coated film was dried in a dim light, then exposed to sunlight under a negative. Coloration proceeded rapidly and gave a red print. Visible light projected through this transparency and gave a weak green image on a white surface.

EXAMPLE 14

Direct Photographs

With the use of silver halide crystals sensitized to specific wave bands of light by techniques known to the art, in conjunction with an iridescent pigment whose interference-reinforced reflection color corresponds to that wave band, the resultant color in the print will correspond directly with the color of the incident light, to yield a direct positive print upon development without the need for a negative. For example, silver halide crystals sensitized to green, and attached to Iridescent Green particles, will give black silver particles attached to the Iridescent Green particles upon exposure to green light and development. The black silver will then enhance the Iridescent Green reflection color to give a green print. This has long been the goal of color photography, but prior to the present discovery, it could be achieved only by complicated processes and coatings. The system of the present invention may yield one-color or multi-color prints.

Direct photographs were made with light-recording films of the present invention by rolling the coated papers and coated plastic base supports onto spools, which were inserted into a box-type camera with speed-adjustable shutter. Bright sunlight was used and an ultra-violet absorbing filter was placed over lens. Short exposures (1–10 seconds) have good results in bright sunlight; in indirect light, 15–90 seconds gave good results when the silver halide was not sensitized. Development with standard developers (hydroquinone and p-methylaminophenol mixtures) gave prints with intense colors where light hit and no colors where light did not strike the film. Development time and developer concentrations were varied with exposure time, as appropriate; in general, two minutes development in cool Dextol developer and ten minutes in cool Kodak Fixer (after immersion in an acetic acid stop-bath) were adequate.

In the preferred practice of the invention, as shown in the foregoing examples, the pigment comprises a mica, or at least a micaceous, substrate overcoated with $TiO_2$. However, the use of other transparent flake-like particles, such as glass, anhydrous $CaSO_4$ or $BaSO_4$, as the substrate or base is also contemplated, as is the use of other overcoating materials which are transparent and which have a refractive index sufficiently greater than that of the substrate, such as $ZrO_2$.

It should be clearly understood that the invention is not limited to the examples cited but is broadly applicable to the entire field of photography. Iridescent pigments, used in accordance with the present invention, will provide intensely colored images from what would otherwise be black and white images. They can be used with positive emulsions (i.e., emulsions which upon development yield no silver where light strikes but which do yield silver where no light strikes, to yield a positive colored image) and they can also be used with negative emulsions.

The intensely colored purple prints obtained from silver-enhanced Iridescent Purple pigment or form a mixture of a silver-enhanced Iridescent Blue with silver-enhanced Iridescent Red have an aesthetically attractive appearance which renders them more interesting than present day black and white prints and permits the use of far less silver in the final image than is used in conventional black and white prints.

The prints of the present invention have very good light-stability and are the result of a simple and inexpensive method for forming intensely colored prints with standard developers. From this disclosure, other embodiments and applications will be apparent to those skilled in the photographic and printing arts.

Having described my invention, I claim:

1. A photosensitive composition of matter which comprises a mixture of
   particles of an iridescent pigment of the type which displays an interference-reinforced reflection color, the particles of said pigment individually comprising an essentially transparent micaceous substrate having thereon at least one overcoating of an essentially transparent material having a refractive index greater than about 2.0,
   and particles of a light-sensitive silver compound which, through exposure to light, can be converted to particles having an absorption band complementary to the interference-reinforced reflection color of said of said iridescent pigment.

2. A photo-sensitive composition of matter which comprises a mixture of
   particles of an iridescent pigment of the type which displays an interference-reinforced reflection color, the particles of said pigment individually comprising an essentially transparent micaceous substrate having thereon at least one overcoating of an essentially transparent material having a refractive index greater than about 2.0,
   and particles of a light-sensitive silver halide selected from the group of halides consisting of silver chloride, bromide, iodide, and mixtures thereof, which through exposure to light, can be converted to particles having an absorption band complementary to the interference-reinforced reflection color of said iridescent pigment.

3. The composition of claim 2 wherein the substrate is mica.

4. The composition of claim 2 wherein the overcoating is of titanium dioxide.

5. The composition of claim 2 wherein the overcoating is of zirconium oxide.

6. a light-sensitive layer comprising, in combination, a mixture of
   particles of a light-sensitive silver halide
   and particles of an iridescent pigment of the type which displays an interference-reinforced reflection color, the particles of said pigment individually comprising an essentially transparent plate-like substrate having thereon at least one overcoating of an essentially transparent material having a refractive index substantially greater than that of the substrate,
   said mixture dispersed in a binder.

7. The layer of claim 6 wherein the iridescent pigment particles individually comprise a mica substrate having an overcoating of titanium dioxide.

8. The layer of claim 6 wherein the iridescent pigment particles individually comprise a mica substrate having an overcoating of zirconium oxide.

9. The layer of claim 6 wherein the light-sensitive silver halide particles are on and around the pigment particles.

10. The composition of claim 2 wherein the particles of silver halide are on and around the particles of the pigment.

11. An image-recording element comprising
    a support, said support having thereon a mixture of particles of a light-sensitive silver halide,
    and particles of an iridescent pigment of the type which displays an interference-reinforced reflection color, the particles of said pigment individually comprising an essentially transparent plate-like substrate having thereon at least one overcoating of an essentially transparent material having a refractive index substantially greater than that of the substrate, said mixture dispersed in a binder which adheres it to said support.

12. A photographic printing sheet which comprises a supporting sheet having thereon a mixture of particles of a light-sensitive silver halide and particles of an iridescent pigment of the type which displays an interference-reinforced reflection color, the particles of said pigment individually comprising an essentially transparent micaceous substrate having thereon at least one overcoating of an essentially transparent material having a refractive index greater than about 2.0, said mixture dispersed in a binder.

13. The photographic printing sheet of claim 12 wherein said binder is a hydrophyllic colloid.

14. The photographic printing sheet of claim 13 wherein said binder is gelatin.

15. The photographic process which comprises exposing to the action of light a photographic medium which comprises a mixture of a light-sensitive recording material which is a silver compound, and particles of an iridescent pigment of the type which displays an interference-reinforced reflection color and which comprises an essentially transparent micaceous substrate having thereon at least one overcoating of an essentially transparent material having a refractive index greater than about 2.0, and thereafter transforming the light-sensitive recording material in situ into finely divided light-absorbing particles which will absorb wavelengths complementary to the interference-reinforced reflection color of the pigment, said light-absorbing particles being closely proximate to the pigment particles and markedly enhancing the interference-reinforced reflection color of the pigment, to provide an intense color on said photographic medium.

16. The process of claim 15 wherein the light-sensitive material is a finely divided silver halide.

17. The process of claim 16 wherein the silver halide is a precipitate on the surfaces of the pigment particles.

18. The process of claim 16 wherein the transforming of the silver halide is carried out by developing, stopping, and fixing it.

19. In the photographic process, the improvement which comprises, including an iridescent pigment in a photographic emulsion which contains a light-sensitive silver halide, said pigment being of the type which displays an interference-reinforced reflection color and which comprises an essentially transparent micaceous substrate having thereon at least one overcoating of essentially transparent material having a refractive index greater than about 2.0, said pigment being dispersed in the emulsion, exposing the emulsion to light to activate the light-sensitive silver halide, and thereafter developing the emulsion to convert the exposed silver halide to finely divided silver, thereby forming an intense coloration.

20. The improvement of claim 19 wherein the weight of the silver in said halide comprises about 0.0% to about 25% of the weight of the iridescent pigment.

21. The improvement of claim 19 wherein the weight of the silver in said halide comprises about 1% to about 5% of the weight of the iridescent pigment.

22. In the manufacture of a light-sensitive silver halide photographic emulsion which ordinarily would yield black and white images, the method of making the emulsion capable of providing colored images comprising, including in the silver halide emulsion an iridescent pigment of the type which displays in interference-reinforced reflection color and which comprises an essentially transparent micaceous substrate having thereon at least one overcoating of essentialy transparent material having a refractive index greater than about 2.0, the weight of the silver in the silver halide comprising about 0.1% to about 25% of the weight of the iridescent pigment;

development of the silver halide to metallic silver markedly enhancing the iridescent pigment's interference-reinforced reflection color to provide a colored image.

23. The process of forming an image in color which comprises forming on a support a light-sensitive recording layer which comprises an intimate mixture of finely divided light-sensitive silver halide particles and an iridescent pigment of the type which displays an interference-reinforced reflection color and which comprises an essentially transparent plate-like substrate having thereon at least one overcoating of an essentially transparent material having a refractive index which is substantially greater than that of the substrate, said mixture being dispersed in a binder therefor which holds it to said support, exposing the light-sensitive layer to light, selectively developing the exposed silver halide to metallic silver particles, the silver particles markedly enhancing the iridescent pigment's interference-reinforced reflection color and thereby forming an intensely colored print.

* * * * *